(12) United States Patent
Parkhe et al.

(10) Patent No.: US 8,971,009 B2
(45) Date of Patent: Mar. 3, 2015

(54) ELECTROSTATIC CHUCK WITH TEMPERATURE CONTROL

(71) Applicant: Applied Materials, Inc., Santa Clara, CA (US)

(72) Inventors: Vijay D. Parkhe, San Jose, CA (US); Steven V. Sansoni, Livermore, CA (US); Cheng-Hsiung Matthew Tsai, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 231 days.

(21) Appl. No.: 13/630,196

(22) Filed: Sep. 28, 2012

(65) Prior Publication Data

US 2013/0088809 A1 Apr. 11, 2013

Related U.S. Application Data

(60) Provisional application No. 61/542,068, filed on Sep. 30, 2011, provisional application No. 61/542,746, filed on Oct. 3, 2011.

(51) Int. Cl.
*F28F 3/00* (2006.01)
*H02N 13/00* (2006.01)
(Continued)

(52) U.S. Cl.
CPC *F28F 3/00* (2013.01); *H02N 13/00* (2013.01); *B23Q 3/15* (2013.01); *B23Q 3/1543* (2013.01); *H01L 21/67109* (2013.01); *H01L 21/683* (2013.01); *H01L 21/6831* (2013.01)
USPC ........................................ 361/234

(58) Field of Classification Search
USPC ........................................ 361/234
See application file for complete search history.

(56) References Cited

U.S. PATENT DOCUMENTS 6,740,853 B1 * 5/2004 Johnson et al. ............ 219/444.1
6,753,508 B2 * 6/2004 Shirakawa ................ 219/444.1
(Continued)

FOREIGN PATENT DOCUMENTS

JP 11-307513 A 11/1999

OTHER PUBLICATIONS

International Search Report and Written Opinion mailed Dec. 26, 2012 for PCT Application No. PCT/US2012/057949.
(Continued)

*Primary Examiner* — Thienvu Tran
*Assistant Examiner* — Kevin J Comber
(74) *Attorney, Agent, or Firm* — Moser Taboada; Alan Taboada

(57) ABSTRACT

Embodiments of an apparatus for controlling a temperature of an electrostatic chuck in a process chamber are provided herein. In some embodiments, the apparatus includes an electrostatic chuck disposed in a process chamber, the electrostatic chuck including a ceramic plate having a substrate supporting surface, and a cooling assembly including a plurality of cooling plates disposed below the electrostatic chuck to adjust the cooling capacity of the electrostatic chuck. In some embodiments, the plurality of cooling plates includes an inner cooling plate configured to control a temperature of a center portion of the electrostatic chuck, and an outer cooling plate configured to control a temperature of an outer portion of the electrostatic chuck. In some embodiments, the plurality of cooling plates includes an upper cooling plate that contacts a bottom surface of the electrostatic chuck, and a lower cooling plate which contacts a bottom surface of the upper cooling plate.

20 Claims, 6 Drawing Sheets

(51) Int. Cl.
*B23Q 3/15* (2006.01)
*B23Q 3/154* (2006.01)
*H01L 21/67* (2006.01)
*H01L 21/683* (2006.01)

(56) References Cited

U.S. PATENT DOCUMENTS

2002/0050246 A1* 5/2002 Parkhe .................. 118/500
2005/0133167 A1* 6/2005 Camm et al. ............ 156/345.51
2008/0017104 A1* 1/2008 Matyushkin et al. ......... 118/696
2009/0201622 A1* 8/2009 Brown et al. ................. 361/234
2010/0039747 A1 2/2010 Sansoni et al.

OTHER PUBLICATIONS

U.S. Appl. No. 13/630,136, filed Sep. 28, 2012, Parkhe et al.

* cited by examiner

ELECTROSTATIC CHUCK WITH TEMPERATURE CONTROL

CROSS-REFERENCE TO RELATED APPLICATIONS

This application claims benefit of U.S. provisional patent application Ser. No. 61/542,068, filed Sep. 30, 2011, and U.S. provisional patent application Ser. No. 61/542,746, filed Oct. 3, 2011, each of which are herein incorporated by reference.

FIELD

Embodiments of the present invention generally relate to electrostatic chucks for supporting substrates.

BACKGROUND

Electrostatic chucks may be utilized to secure a substrate to be processed to a substrate support. Elements of an electrostatic chuck may include electrodes to secure the substrate or grooves disposed in a surface of the electrostatic chuck to provide a backside gas to a backside surface of the substrate. Some typical electrostatic chucks have fixed cooling capacity as only one cooling plate is used. However, a single cooling plate does not provide for variable cooling capacity depending on temperature usage or substrate cooling demand. Such elements of the electrostatic chuck may affect processing of the substrate. Accordingly, improved electrostatic chuck designs are provided herein.

SUMMARY

Embodiments of electrostatic chucks having temperature control for use in a process chamber are provided herein. In some embodiments, the apparatus includes an electrostatic chuck disposed in a process chamber, the electrostatic chuck including a ceramic plate having a substrate supporting surface, and a cooling assembly including a plurality of cooling plates disposed below the electrostatic chuck to adjust the cooling capacity of the electrostatic chuck. In some embodiments, the plurality of cooling plates includes an inner cooling plate configured to control a temperature of a center portion of the electrostatic chuck, and an outer cooling plate configured to control a temperature of an outer portion of the electrostatic chuck. In some embodiments, the plurality of cooling plates includes an upper cooling plate that contacts a bottom surface of the electrostatic chuck, and a lower cooling plate which contacts a bottom surface of the upper cooling plate.

In some embodiments, an apparatus for processing a substrate, includes a chamber defining a process region, an electrostatic chuck for retaining a substrate in the process region, the electrostatic chuck including a ceramic plate having a substrate supporting surface, a plurality of electrodes disposed within the ceramic plate, wherein each of the plurality of electrodes is separately controllable, a plurality of grooves formed in the substrate supporting surface of the ceramic plate, and a plurality of power sources, each power source coupled to a corresponding electrode in the plurality of electrodes such that each electrode is independently controlled, and a cooling assembly including a plurality of cooling plates disposed below the electrostatic chuck to adjust the cooling capacity of the electrostatic chuck.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
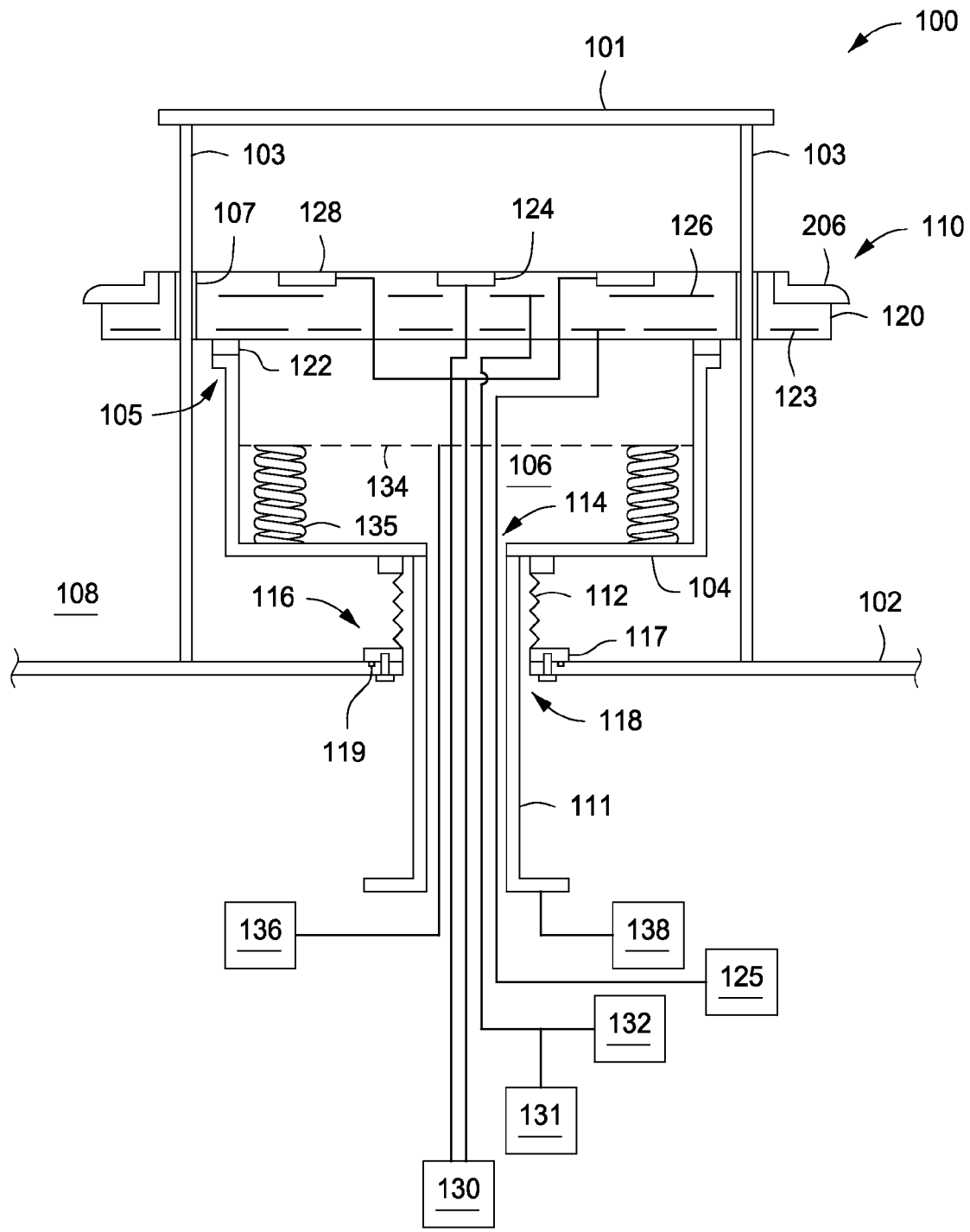
FIG. 1 depicts a side schematic view of a substrate support in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of electrostatic chucks are provided herein. The inventive apparatus may advantageously provide improved substrate processing, for example, such as by limiting arcing between a plasma and elements of the substrate support and/or by controllably adjusting the amount of chucking power provided by the electrostatic chuck to regions of a substrate disposed thereon. Further, the electrostatic chuck may be mounted such that it may be detachable and/or replaceable. In some embodiments, the substrate support may be utilized at high temperatures, for example, ranging from about 200 to about 450 degrees Celsius. In some embodiments, the substrate support may be utilized with substrates having diameters greater than about 400 millimeters. Other and further advantages are discussed below.

FIG. 1 depicts a side schematic view of a substrate support 100 in accordance with some embodiments of the present invention. As illustrated in FIG. 1, the substrate support 100 is configured in a loading position to either receive or remove a substrate 101. For example, as illustrated in FIG. 1 and in the loading position, the substrate 101 may rest on a plurality of lift pins 103 above the substrate support 100. The lift pins 103 are movable with respect to a support surface of the substrate support 100, for example, via lift pin holes 107 that facilitate relative movement of the lift pins 103. The substrate support 100 may be disposed in a process chamber (a cut away view of a chamber wall 102 is illustrated in FIG. 1). The process chamber may be any suitable substrate processing chamber.

The substrate support 100 may include a body 104. The body 104 may have an interior volume 106 that is separated from a processing volume 108 of the process chamber. The interior volume 106 may be held at atmosphere, for example, about 14.7 pounds per square inch (psi), or be held under an inert atmosphere, such as nitrogen ($N_2$) or the like. The interior volume 106 is further isolated from, and protected from, any gases that may be present in the processing volume 108 of the process chamber. The process volume 108 may be held at atmospheric or sub-atmospheric pressures.

The interior volume 106 may be enclosed by an electrostatic chuck 110 at an upper end 105 of the body 104 and by a feedthrough structure 111, which may be welded or brazed to a lower opening 114 of the body 104. For example, as illustrated in FIG. 1, a bellows 112 may surround at least a portion of the feedthrough structure 111 and isolate the processing volume 108 from the exterior of the chamber and the interior volume 106. The bellows 112 may provide both a flexible section to facilitate motion of the substrate support 100 and a pathway for providing gases, electrical power, coolants and the like to the substrate support 100. The gases, electrical power, coolant and the like may be by provided via the feedthrough structure 111.

The bellows 112 may be coupled to the body 104 at the lower opening 114, for example, by welding or brazing. An opposing lower end 116 of the bellows 112 may be coupled to an opening 118 in the chamber wall 102. For example, as illustrated in FIG. 1, the lower end 116 of the bellow 112 may include a flange 117 which may be coupled via an o-ring 119, or copper gasket or the like to the chamber wall 102. The o-ring 119 may rest in a groove on the processing volume facing surface of the chamber wall 102. Other designs and coupling of the bellows 112 to the body 104 and the chamber wall 102 are possible.

The substrate support 100 may include a cooling plate 134 disposed in the interior volume 106 below the electrostatic chuck 110. For example, in some embodiments, the cooling plate 134 may be directly contacting an interior volume facing surface of the electrostatic chuck 110. However, this embodiment of the cooling plate 134 is merely exemplary and the cooling plate may not directly contact the electrostatic chuck 110. The cooling plate 134 may include a plurality of cooling channels (not shown) for circulating a coolant therethrough. The coolant may include any suitable liquid or gas coolant. In some embodiments, the coolant may be supplied to the cooling plate 134 via a coolant source 136 coupled to the cooling plate 134 via the feedthrough structure 111. For example, the cooling plate 134 may be engaged to the electrostatic chuck 110 by one or more springs 135 or any suitable engagement mechanism. Other and further embodiments of the cooling plate 134 are illustrated in FIGS. 2A-C and discussed below.

The electrostatic chuck 110 may include a ceramic plate 120. As illustrated in FIG. 1, the ceramic plate 120 may rest on a ring 122 disposed between the electrostatic chuck 110 and the upper end 105 of the body 104. For example, the ring 122 may comprise KOVAR™, or any suitable material. The ring 122 may secure the electrostatic chuck 110 to the upper end 105 of the body 104, for example, by welding or brazing the ring 122 to both the electrostatic chuck 110 and the upper end 105 of the body 104. The ceramic plate 120 may comprise any suitable ceramic material, such as aluminum nitride (AlN), aluminum oxide ($Al_2O_3$), or a doped ceramic, such as titania doped alumina or calcium doped aluminum nitride or the like. As illustrated in FIG. 1, the ceramic plate 120 may include a plurality of grooves 124 formed in a substrate supporting surface of the ceramic plate 120. The grooves may be used, for example, to provide a backside gas to a backside surface of the substrate 101. The grooves are discussed in more detail below with respect to FIG. 3. The ceramic plate 120 may further include a plurality of electrodes 126, where the plurality of electrodes 126 may be used to secure the substrate 101 to a processing surface 128 of the electrostatic chuck 110. The electrodes 126 are discussed in more detail below and illustrated in FIGS. 4A-B.

The electrostatic chuck 110 may further include one or more heaters 123. The one or more heaters 123 may be coupled to one or more power supplies 125 and may be independently controllable. The one or more heaters 123 are discussed in more details below in accordance with FIGS. 2A-C.

Figure 2A:
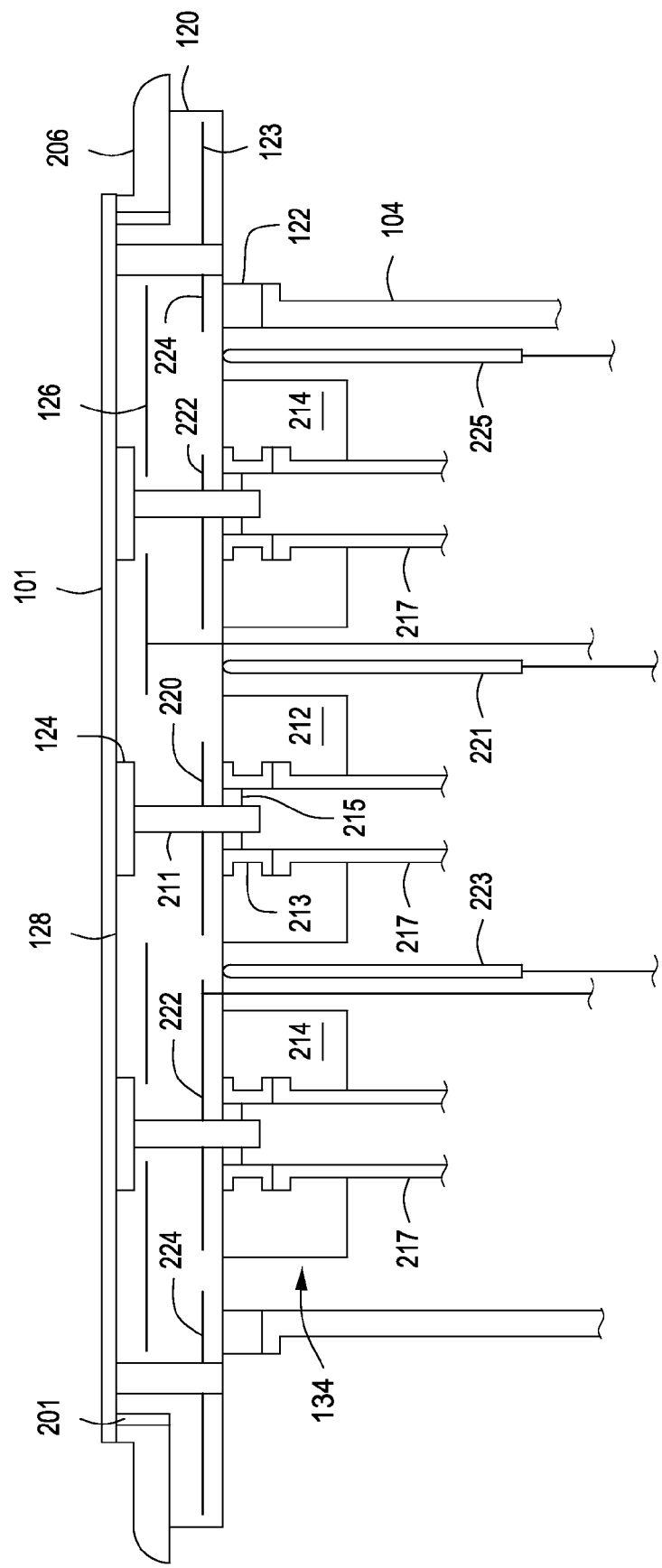
FIG. 2A-C depicts a side schematic views and top views of an electrostatic chuck in accordance with some embodiments of the present invention.
Figure 2B:
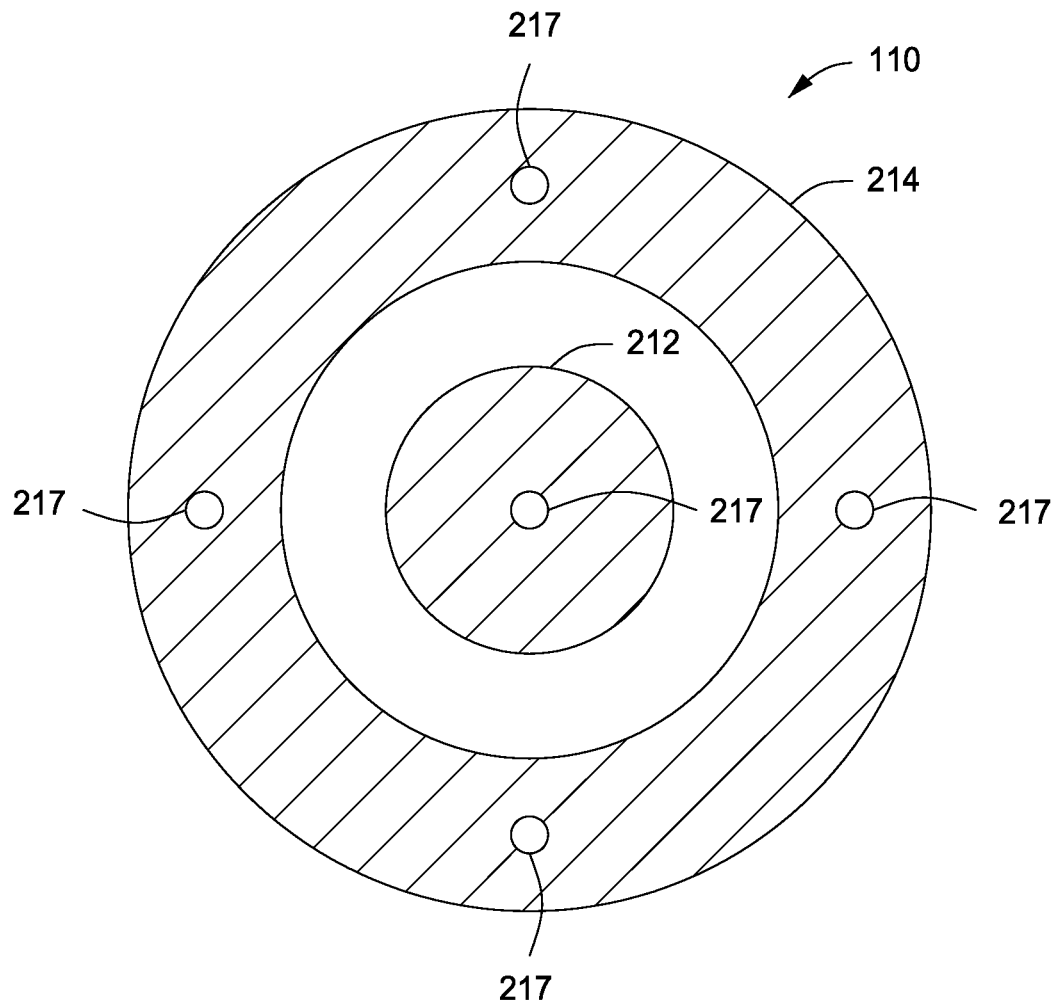
Figure 2C:
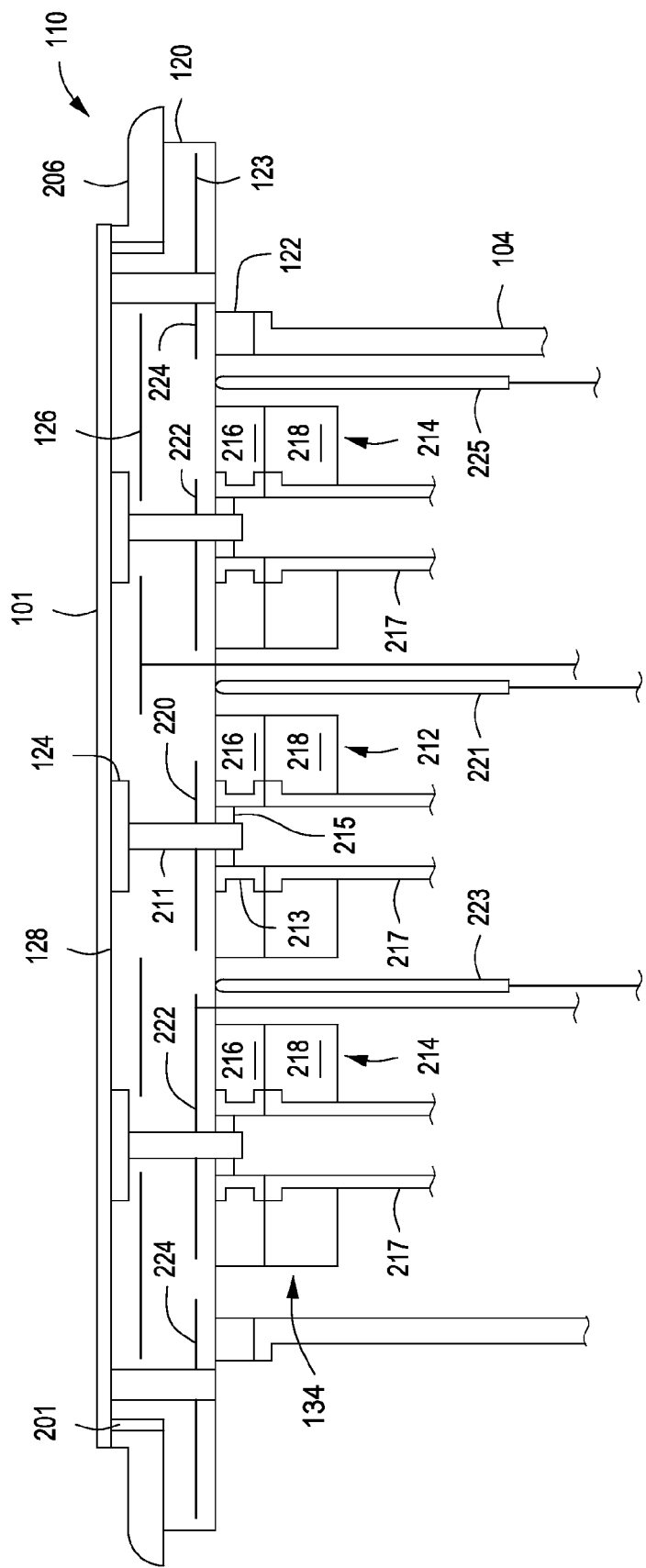

As illustrated in FIG. 2A, the electrostatic chuck 110 may include a deposition ring 206 disposed about the ceramic plate 120 and covering at least some of the exposed portions of the ceramic plate 120 as illustrated in FIG. 2A. In some embodiments, a gap 201 exists between the ceramic plate 120 and the deposition ring 206. However, the gap 201 may be optional, and in some embodiments, the deposition ring 206 may contact the ceramic plate 120. The deposition ring 206 may comprise one or more of aluminum oxide ($Al_2O_3$), silicon carbide (SiC), stainless steel, titanium (Ti), or the like. The deposition ring 206 may be used to protect exposed portions of the electrostatic chuck 110 from damage during substrate processing or to prevent deposition of materials onto such surfaces. For example, damage may include arcing or the like.

As illustrated in FIG. 2A, the deposition ring 206 may have a surface profile that is approximately flat and below the level of the substrate 101 when disposed in a processing position on the processing surface 128 of the electrostatic chuck 110. Alternatively, (not shown) the deposition ring 206 may have a sloped profile such as thicker proximate a peripheral edge of the substrate 101 and thinner proximate a peripheral edge of the ceramic plate 120. For example, a sloped profile may reduce an accumulation of contaminants, process materials, or the like on the deposition ring 206.

In some embodiments, a gas source (i.e., gas source 130 discussed below and illustrated in FIG. 1) may be coupled to the plurality of grooves 124 via one or more porous plugs 211. For example, the one or more porous plugs 211 may comprise any suitable porous ceramic material such as aluminum nitride (AlN), aluminum oxide ($Al_2O_3$), or the like. The one or more porous plugs 211 may be used to provide a gas to the grooves 124 at a desired flow rate, for example such as at a density or flow rate that will limit or prevent arc of gas due to proximity with the electrodes 126 which may be operated at high frequency and/or power as discussed below. For example, In some embodiments, the one or more porous plugs 211 may be coupled to an interior volume facing surface of the ceramic plate 120 via ring 213. For example, the ring 213 may be KOVAR™ or the like and may be coupled to the interior volume facing surface of the ceramic plate 120 with any suitable brazing material such as copper, silver, or the like. In some embodiments, the one or more porous plugs 211 may be coupled to the ring 213 via a structure 215, such as a metallic sleeve or a plurality of metal pins that may be brazed or welded to an interior surface of the ring 213. In some embodiments, a gas line 217 may be brazed or welded to the ring 213 to provide the gas from the gas source 130 as discussed below. For example, the ring 213 may be KOVAR™ or the like and may be coupled to the interior volume facing surface of the ceramic plate 120 any suitable brazing material such as copper silver or the like. In some embodiments, the one or more porous plugs 211 may be coupled to the ring 213 via a structure 215, such as a metallic sleeve or a plurality of metal pins that may be brazed or welded to an interior surface of the ring 213. In some embodiments, a gas line 217 may be brazed or welded to the ring 213 to provide the gas from the gas source 130 as discussed below.

In some embodiments, the cooling plate 134 may include an inner and outer cooling plate 212, 214. In some embodiments, as illustrated in top down view in FIG. 2B, the inner cooling plate 212 may be disposed about the center gas line 217 and the outer cooling plate 214 may be disposed about a plurality of outer gas lines 217. For example, the inner and outer cooling plates 212, 214 may be used to adjust cooling capacity depending on how the electrostatic chuck 110 is utilized, such as how electrical power is provided to the electrodes 126 and/or the one or more heaters 123 or the like. Further, the inner and outer cooling plates 212, 214 may be utilized to improve substrate temperature control or cool down the substrate support 100 from high temperatures. For example, the inner and outer cooling plates 212, 214 may be modulated to control heat transfer between the one or more heaters 123 and the substrate 101.

In some embodiments, the cooling plate 134 may include an upper and a lower cooling plate 216, 218, as illustrated in FIG. 2C. The upper and lower cooling plates 216, 218 may be utilized to provide similar benefits as discussed above for the inner and outer cooling plates 212, 214. The upper and lower cooling plates 216, 218 may be stacked such that upper cooling plate contacts the electrostatic chuck 110 via a foil while lower cooling plate contacts upper cooling plate. By independently controlling the flow of coolant to the upper and lower cooling plates, variable heat transfer is achieved between ceramic body 120 and cooling plate assembly 134.

In some embodiments, each of the upper and lower cooling plates 216, 218 may provide uniform cooling over the entire diameter of cooling plate 134. In other embodiments, each of upper and lower cooling plates 216, 218 may provide different cooling to inner and outer regions of cooling plate 134. That is, in some embodiments, upper and lower cooling plates 216, 218 may be combined with inner and outer cooling plates 212, 214.

In some embodiments, the one or more heaters 123 may include a plurality of heaters 123, as illustrated in FIGS. 2A and 2C. For example, in some embodiments, the plurality of heaters 123 may include a central heater 220, a middle heater 222 disposed about the central heater 220, and an outer heater 224 disposed about the middle heater 222. Each of the central, middle and outer heaters 220, 222, 224 may be coupled to the same or separate one or more power supplies 125 and independently controlled via a temperature feedback loop. For example, a first thermocouple 221 may monitor a temperature of the ceramic plate 120 proximate the location of the central heater 220. Similarly, thermocouples 223 and 225 may do the same for the middle and outer heaters 222, 224 respectively.

Figure 3:
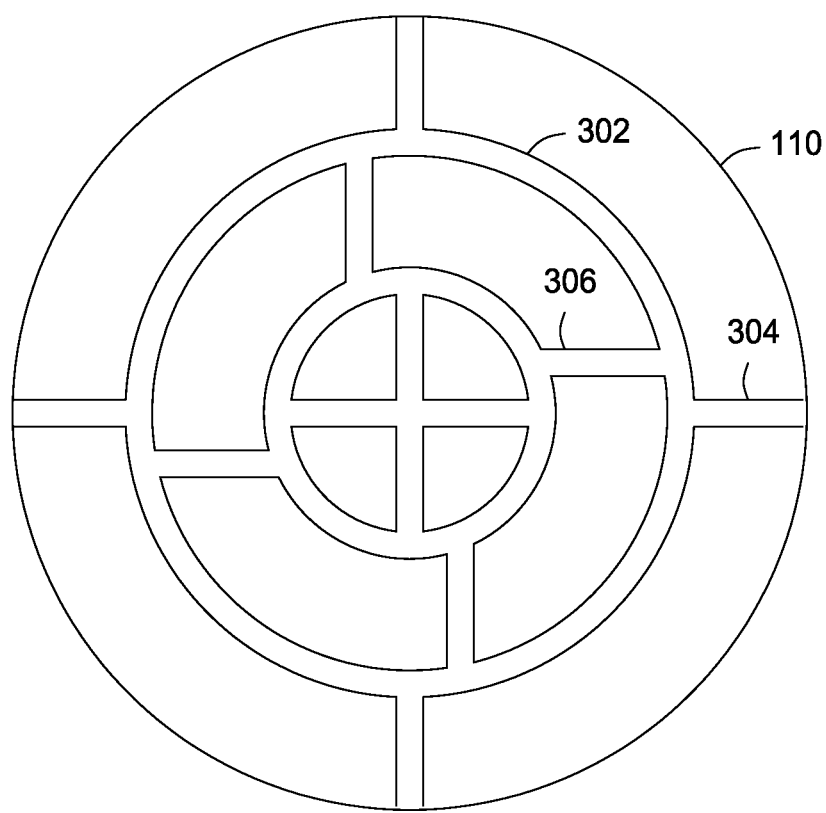
FIG. 3 depicts a top down schematic view of grooves in a substrate facing surface of an electrostatic chuck in accordance with some embodiments of the present invention.

The plurality of grooves 124 disposed in the processing surface 128 of the electrostatic chuck 110 is illustrated in accordance with some embodiments of the invention in FIG. 3. For example, as discussed above, the plurality of grooves 124 may be utilized to provide a backside gas to the backside surface of the substrate 101. For example, the gas may be used to facilitate uniform heat transfer between the ceramic plate 120 and the substrate 101. Further, the pressure of the grooves 124 may be monitored, for example, by a pressure transducer or any suitable pressure sensing device. For example, a pressure drop in the grooves 124 may signal that the substrate 101 is damaged, for example, such as cracked or the like. As a result of the pressure drop, the deposition process in the chamber may shut down to prevent exposure of the electrostatic chuck 110 to the process environment.

In some embodiments, the plurality of grooves 124 may include a plurality of circular grooves 302, a plurality of radial grooves 304, and a plurality of offset grooves 306, as illustrated in FIG. 3. In some embodiments, offset grooves 306 are non-radial offset grooves. As used herein, non-radial offset grooves are grooves that do not follow with a line which extends radially from the center of the ceramic plate 120. For example, in some embodiments, the plurality of circular grooves 302 may be concentric and fluidly coupled via the plurality of offset grooves 306. The plurality of radial grooves 304 may be fluidly coupled and disposed at the interior of an innermost circular groove and at the exterior of the outermost circular groove. However, this design is merely exemplary and other configurations are possible. For example, in some embodiments, the radial grooves do not continuously extend from the interior of the ceramic plate 120 to a peripheral edge of the ceramic plate 120. In some embodiments, the radial grooves do not extend more than between one set of circular grooves, or do not extend longer than any length suitable to limit arcing by the plasma in the grooves 124. For example, arcing may occur at high power or high frequency in long, continuous radial grooves. Accordingly, in some embodiments the plurality of offset grooves 306 is introduced to limit the length of the radial grooves 304. For example, arcing may occur in a gas flowing through the grooves at high power and/or high frequency if long, continuous radial grooves are used. In some embodiments, the length of the radial and/or offset grooves 304, 306 may range from about 2 to about 5 centimeters. However, other lengths may be utilized.

Figure 4A:
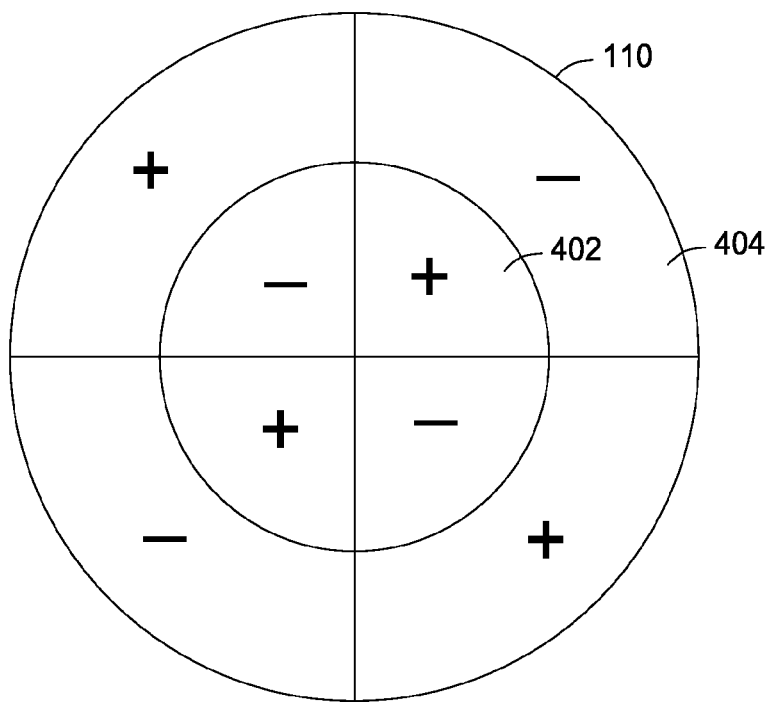
FIGS. 4A-B depict top down schematic views of electrodes in an electrostatic chuck in accordance with some embodiments of the present invention.
Figure 4B:
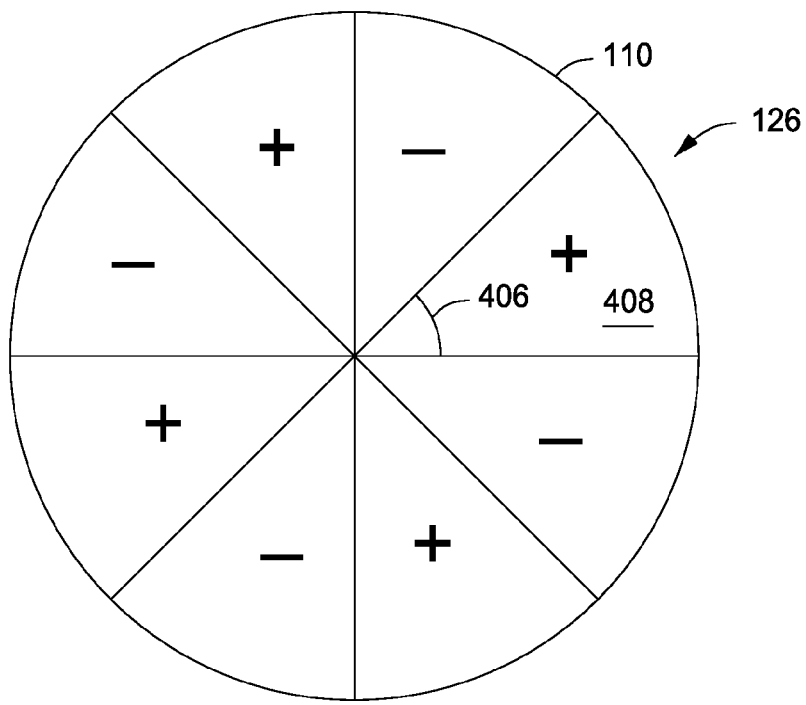

FIGS. 4A-B illustrate the plurality of electrodes 126 in accordance with some embodiments of the invention. For example, as discussed above the plurality of electrodes 126 may be utilized to secure the substrate 101 to the processing surface 128 of the electrostatic chuck 110. For example, in some embodiments, the plurality of electrodes 126 as arranged in FIGS. 4A-B may utilized for controlled de-chucking from the electrostatic chuck 110, to chuck bowed substrates, or the like. For example, during de-chucking, gas may still be flowing through the grooves 124 and/or the pressure in the grooves may be higher than the pressure in the processing volume 108. Accordingly, for example, to prevent the substrate 101 from jumping off the electrostatic chuck 110, some of the electrodes 126 may be turned off prior to others to gradually de-chuck the substrate 101. For example, during chucking, larger substrates, such as 400 millimeter or greater, may be bowed. Accordingly, to flatten a bowed substrate against the electrostatic chuck 110, some of the electrodes 126 may be operated at a higher power and/or frequency than others of the electrodes 126 to flatten out the substrate.

As illustrated in FIG. 4A, the plurality of electrodes 126 may be arranged in a concentric pattern, wherein a plurality of exterior electrodes 404 are disposed about a plurality of interior electrodes 402. For example, as illustrated in FIG. 4A, each quadrant of the ceramic plate 120 includes one exterior electrode 404 disposed radially outward of one interior electrode. However, any suitable number of interior and exterior electrodes 402, 404 may be utilized. In addition, the polarity of respective adjacent electrodes may be controlled to be opposite of each other such that no two adjacent electrodes have the same polarity.

As illustrated in FIG. 4B, the plurality of electrodes 126 may be arranged in a radial pattern about the ceramic plate 120, wherein each electrode occupies an area 406 between a center and peripheral edge of the ceramic plate 120 defined by a radial angle 408. For example, as illustrated in FIG. 4B, in some embodiments, there may be eight electrodes 126 occupying eight areas 406, where each area 408 is defined by the same radial angle 406. In addition, the polarity of respective adjacent electrodes may be controlled to be opposite of each other such that no two adjacent electrodes have the same polarity.

Returning to FIG. 1, the substrate support 100 may include the feedthrough structure 111 to provide a pathway, for example, to provide gas to the plurality of grooves 124, provide electrical power to the plurality of electrodes 126, or the like from sources external to the process chamber. For example, as illustrated in FIG. 1, a gas source 130 and power sources 131, 132 may be respectively coupled via the feedthrough structure 111 to the plurality of grooves 124 and the plurality of electrodes 126. For example, (not shown) the power sources 131, 132 may be a plurality of power sources, for example, such that each power source may be coupled to each electrode 126 such that each electrode 126 may be independently controlled. For example, the power source 132 may be utilized to provide RF power at a frequency ranging from about 13.56 MHz to about 100 MHz. In some embodiments, the frequency may be about 60 MHz. For example the power source 131 may be used to provide DC power, for example, to chuck or de-chuck the substrate 101. For example, the gas source 130 may be coupled to the plurality of grooves 124 at more than one entry point as illustrated in FIG. 1. For example, a central gas line may be used to provide gas to the central entry point and an outer gas line may be used to provide gas to the plurality of outer entry points as illustrated in FIG. 1. However, other suitable embodiments of providing the gas to the grooves 124 are possible.

In operation, to move the substrate support from a loading position to a processing position, a lift mechanism 138 may engage the feedthrough structure 111 such that the feedthrough structure 111 lifts the substrate support 100 into the processing position. The lift pins 103 may remain stationary as the substrate support 100 is raised towards the substrate 101 which rests on the lift pins 103 as illustrated in FIG. 1.

While the foregoing is directed to embodiments of the present invention, other and further embodiments of the invention may be devised without departing from the basic scope thereof.

We claim:

1. Apparatus for controlling a temperature of an electrostatic chuck in a process chamber, comprising:
   an electrostatic chuck disposed in a process chamber, the electrostatic chuck including a ceramic plate having a substrate supporting surface; and
   a cooling assembly including a plurality of cooling plates disposed below the electrostatic chuck to adjust a cooling capacity of the electrostatic chuck, wherein the plurality of cooling plates includes an inner cooling plate configured to control a temperature of a center portion of the electrostatic chuck, and an annular outer cooling plate configured to control a temperature of an outer portion of the electrostatic chuck, and wherein the inner cooling plate is disposed within a central opening of the annular outer cooling plate.

2. The apparatus of claim 1, wherein the cooling assembly is engaged to the electrostatic chuck by one or more springs disposed between a bottom surface of the cooling assembly and a body of the process chamber.

3. The apparatus of claim 1, wherein each of the plurality of cooling plates includes one or more coolant channels configured to circulate a coolant therethrough.

4. The apparatus of claim 1, wherein temperatures of the inner and outer cooling plates are independently controllable.

5. The apparatus of claim 1, wherein top surfaces of the inner and outer cooling plates are in contact with a bottom surface of the electrostatic chuck.

6. The apparatus of claim 1, further comprising:
   a plurality of grooves formed in the substrate supporting surface of the ceramic plate configured to flow a gas across a bottom surface of a substrate when disposed on the electrostatic chuck;
   a center gas line to provide gas to at least one of the plurality of grooves via a central entry point in the ceramic plate; and
   a plurality of outer gas lines to provide gas to at least some of the plurality of grooves via a plurality of outer entry points in the ceramic plate.

7. The apparatus of claim 6, wherein the center gas line passes through the inner cooling plate, and the plurality of outer gas lines pass through the outer cooling plate.

8. The apparatus of claim 1, further comprising:
   one or more electrodes disposed within the ceramic plate; and
   one or more heaters disposed within the ceramic plate,
   wherein the inner and outer cooling plates are configured to adjust cooling capacity based at least one of (a) an amount of electrical power provided to the one or more electrodes, or (b) heat provided by the one or more heaters.

9. The apparatus of claim 1, wherein the ceramic plate is coupled to a body of a substrate support via an annular ring, wherein the body includes a central opening adjacent the electrostatic chuck that, together with the electrostatic chuck, forms an enclosed cavity below a base plate of the electrostatic chuck, and wherein the inner and outer cooling plates are disposed with the cavity.

10. The apparatus of claim 3, wherein the plurality of cooling plates includes an upper cooling plate that contacts a bottom surface of the electrostatic chuck, and a lower cooling plate which contacts a bottom surface of the upper cooling plate.

11. The apparatus of claim 10, wherein a thermally conductive foil is disposed between the upper cooling plate and the electrostatic chuck.

12. The apparatus of claim 10, wherein temperatures of the upper and lower cooling plates cooling plates are independently controllable by independently controlling a flow of coolant to the upper and lower cooling plates.

13. The apparatus of claim 4, wherein each of the inner and outer cooling plates includes an upper and lower cooling plates, and wherein a temperature of the upper and lower cooling plates included in the inner and outer cooling plates can be independently controlled.

14. An apparatus for processing a substrate, comprising:
   a chamber defining a process region;
   an electrostatic chuck for retaining a substrate in the process region, the electrostatic chuck including:
      a ceramic plate having a substrate supporting surface;
      a plurality of electrodes disposed within the ceramic plate, wherein each of the plurality of electrodes is separately controllable;
      a plurality of grooves formed in the substrate supporting surface of the ceramic plate; and
      a plurality of power sources, each power source coupled to a corresponding electrode in the plurality of electrodes such that each electrode is independently controlled; and
   a cooling assembly including a plurality of cooling plates disposed below the electrostatic chuck to adjust a cooling capacity of the electrostatic chuck, wherein the plurality of cooling plates includes an inner cooling plate configured to control a temperature of a center portion of the electrostatic chuck, and an outer annular cooling plate configured to control a temperature of an outer portion of the electrostatic chuck, and wherein the inner cooling plate is disposed within a central opening of the outer cooling plate.

15. The apparatus of claim 14, wherein temperatures of each of the plurality of cooling plates are independently controllable.

16. The apparatus of claim 15, wherein the plurality of cooling plates includes an upper cooling plate that contacts a bottom surface of the electrostatic chuck, and a lower cooling plate which contacts a bottom surface of the upper cooling plate.

17. The apparatus of claim 14, wherein the plurality of grooves include one or more circular grooves, one or more radial grooves, and one or more offset grooves.

18. The apparatus of claim 14, wherein at least some of the plurality of electrodes are operated at a different power level or frequency than other electrodes in the plurality of electrodes.

19. The apparatus of claim 1, wherein the inner cooling plate does not contact the outer cooling plate.

20. The apparatus of claim 14, wherein the inner cooling plate does not contact the outer cooling plate.

* * * * *